US006505305B1

(12) United States Patent
Olarig

(10) Patent No.: US 6,505,305 B1
(45) Date of Patent: Jan. 7, 2003

(54) FAIL-OVER OF MULTIPLE MEMORY BLOCKS IN MULTIPLE MEMORY MODULES IN COMPUTER SYSTEM

(75) Inventor: Sompong P. Olarig, Cypress, TX (US)

(73) Assignee: Compaq Information Technologies Group, L.P., Houston, TX (US)

( * ) Notice: Subject to any disclaimer, the term of this patent is extended or adjusted under 35 U.S.C. 154(b) by 0 days.

(21) Appl. No.: 09/116,714

(22) Filed: Jul. 16, 1998

(51) Int. Cl.[7] .................................................. H02H 3/05
(52) U.S. Cl. .............................................. 714/5; 714/54
(58) Field of Search ................................ 714/5, 6, 7, 8, 714/29, 42, 54, 718; 711/152, 151

(56) References Cited

U.S. PATENT DOCUMENTS

| | | | | |
|---|---|---|---|---|
| 5,208,813 A | * | 5/1993 | Stallmo .......................... | 714/7 |
| 5,526,482 A | * | 6/1996 | Stallmo et al. ................. | 714/6 |
| 5,588,110 A | * | 12/1996 | DeKoning et al. ............. | 714/5 |
| 5,724,501 A | * | 3/1998 | Dewey et al. .................. | 714/9 |
| 5,905,858 A | * | 5/1999 | Jeddeloh ........................ | 714/52 |
| 6,023,748 A | * | 2/2000 | Peters et al. .................. | 711/151 |
| 6,038,680 A | * | 3/2000 | Olarig ............................ | 714/6 |
| 6,052,798 A | * | 4/2000 | Jeddeloh ........................ | 714/8 |
| 6,073,218 A | * | 6/2000 | DeKoning et al. ........... | 711/150 |

OTHER PUBLICATIONS

Embedded Memory: The All–Purpose Core; EDN Mar. 13, 1998, by Brian Dipert, Technical Editor, pp. 34–50.

Ferro RAMs Headed for Vol. Debut; Electronic Engineering Times Mar. 9, 1998, by Craig Matsumoto and Yoshiko Hara, pp. 1 and 108.

* cited by examiner

*Primary Examiner*—Dieu-Minh Le
(74) *Attorney, Agent, or Firm*—Akin Gump Strauss Hauer & Feld LLP

(57) ABSTRACT

A computer system has a memory controller for controlling accesses to multiple memory modules, each having multiple memory blocks, and a fail-over circuit for failing-over individual memory blocks from multiple memory modules. The digital information stored in an individual memory block that has experienced memory errors in excess of a permissible threshold is copied to an auxiliary memory location. The memory accesses directed to the failed-over memory block are intercepted and redirected to the auxiliary memory location. Tags are stored to identify failed-over memory modules and corresponding auxiliary memory modules, so a tag look-up for an accessed memory address can generate a hit signal when the memory access is to a failed-over memory module and cause the auxiliary memory module to respond to the memory access.

34 Claims, 8 Drawing Sheets

FAIL-OVER OF MULTIPLE MEMORY BLOCKS IN MULTIPLE MEMORY MODULES IN COMPUTER SYSTEM

BACKGROUND OF THE INVENTION

1. Field of the Invention

Generally, the present invention relates to a fail-over feature for handling of memory access errors in a computer system. More specifically, the fail-over feature relates to dynamically replacing or re-mapping memory locations experiencing unacceptable errors.

2. Description of the Related Art

Developments in personal computers have included faster clock speeds for the processor and buses and devices connected to the buses or to various devices attached through interfaces to the computer system. In addition to the developments in clock speed, various other developments have enhanced the processing ability of personal computers, including, but not limited to, larger main memory sizes, internal and external cache subsystems, larger and faster hard drives, faster CD ROM drives and faster modems and networking connections.

Memory modules have long been used in arrays of several modules to provide the main memory for personal computer systems. The use of memory modules has permitted computer makers and users to scale the size of any particular computer's main memory to the desired size. Combinations of memory modules having different sizes installed in the same memory array permit many ranges of scalability. Recently, the size of the memory modules has increased into the gigabyte range.

Two of the most commonly known memory module types are the single in-line memory module (SIMM) and the dual in-line memory module (DIMM). Generally, a SIMM has a line of memory chips on a single printed circuit board (PCB) with a single edge connection. A DIMM, on the other hand, uses a very similar construction, but utilizes both sides of the printed circuit board to provide almost double the memory capacity in almost the same amount of physical space.

Memory accesses, such as from a bus, may be to a single byte of data, or digital information, stored at a single address space or to a large chunk of data stored in contiguous address spaces. Accesses to a large number of contiguous address spaces permits the memory subsystem to perform the data transfer in a direct memory access (DMA), whereby each byte, word, double-word, etc. of data in the contiguous address space is quickly read, written or otherwise accessed, without help from the processor.

Commonly, memory accesses even to a single address space will cause the memory controller to access a larger number of contiguous address spaces which includes the desired address. By doing so, the memory controller accommodates the cache functions of the computer system. A cache is a small, intermediate, fast memory subsystem between a fast processor and a slower memory subsystem. The purpose of a memory cache subsystem assumes that a memory access to a particular address space will usually be followed by a memory access to the next contiguous address space, and so on for several memory accesses. The cache subsystem quickly accesses a larger number of address spaces, referred to as a cache line, surrounding the requested memory address space. The cache line is stored in the cache memory, a memory device with a faster response time than the main memory. Subsequent memory accesses to addresses in the same cache line may be responded to by the cache subsystem much more quickly than by the main memory, so the processor, or other device requesting the memory access, does not have a long waiting period for the access to complete. To provide a cache line, the memory modules may be accessed in memory blocks containing about 16, 32, 64 or 128 bytes or other size depending on the type of processor in the computer system.

Due to various reasons, the data retrieved from a location in a memory module may contain an error. For example, one of the bits may have the opposite value when read than it had when the data was written to the address space. To permit the memory subsystem to check for errors, data may be written with additional bits which, along with the data bits, may be decoded to determine whether one or more of the bits is wrong. For example, 64 bits of data may be stored with 8 additional bits, for a total of 72 bits, so that error checking and correcting (ECC) logic in the memory subsystem can decode all 72 bits to determine the location of an erroneous bit and to correct it before returning the data in response to the memory read access.

An uncorrectable error is one for which the ECC logic cannot determine the location of the error (e.g. there may be too many erroneous bits) and can be fatal to the computer. Since the memory subsystem cannot determine what the information is supposed to be, the processor may interpret it as an invalid command, or a command that sends the processor to perform a completely incorrect function. Either way, the computer system may crash and have to be shut down and rebooted.

An uncorrectable error may be preceded by a number of correctable errors at the same location. Thus, if the memory subsystem or the system software can keep track of the correctable errors that occur in the entire memory array, then a potential risk of a fatal error may be detected before it occurs, and the memory module containing the failing location may be replaced before a catastrophic event occurs to cause a user or an enterprise to lose valuable data or time in performing work. It is, therefore, desirable to have a way to fail-over, or move to a different location, the data before the problem with the memory module causes an uncorrectable error, resulting in a system crash.

The most common problem when a memory module starts to develop errors is typically not due to the entire memory module. Rather, the initial problem is usually due to just one of the cells storing just one bit that has developed a soft, or correctable, error, while the remainder of the memory module, which may contain anywhere from kilobytes to gigabytes of memory, is still good and useable. Thus, failing-over an entire memory module due to an error in a single bit in one memory block is a bit of over-kill. It would be more desirable to fail-over a much smaller chunk of memory, so the standby memory module need not be as large as the largest primary memory module, thereby saving the cost of a large standby memory module. Another advantage in failing-over a smaller chunk of memory would be in the time saved to perform the transfer of information from the failing memory module to the standby memory module, so delays in arbitrating for the memory bus for other memory accesses will be minimized, and the overall performance of the computer system will not be affected.

Errors also tend to occur in a random fashion, wherein one memory block in one memory module may have one bad bit, while th e n next bad bit may be in another memory block in a different memory module. Thus, in the above example, unless the computer user can replace a failed -over memory module as soon as possible e after the fail-over is complete, there is a risk of catastrophic failure to the computer, since the memory system will not be able to fail-over another memory module after another memory error occurs.

SUMMARY OF THE INVENTION

In one embodiment, a computer system according to the present invention includes a bus subsystem, a processing unit, a mass storage device, a memory module array, a memory controller and a memory fail-over subsystem which cooperates with the memory modules of the memory module array to fail-over individual memory blocks in multiple memory modules. Another embodiment includes just the memory controller with the fail-over circuitry for failing-over individual memory blocks in one or more memory modules. Another embodiment is a method of controlling accesses to multiple memory modules, each h having multiple memory blocks, by monitoring errors in accesses to the memory blocks in relation to a permssible error threshold and failing-over only an individual memory block upon detection of memory errors exceeding the permissible error threshold for that memory block. In this manner, digital information intended to be stored in the individual memory blocks is actually stored in an auxiliary memory location. Thus, memory accesses by the processing unit, the mass storage device or other element in the computer system to the failed-over memory blocks of multiple memory modules are redirected to and satisfied by the auxiliary memory. Tags associated with and identifying the failed-over memory blocks are stored in a tag storage location. A tag look-up circuitry compares the upper bits of each memory address with the stored tags to determine whether the memory access is to a failed-over memory block and provides a hit signal in response thereto.

In another embodiment, the computer system includes an error monitoring circuitry which provides error data to the memory controller so that the fail-over subsystem will fail-over an individual memory block when the error data for the individual memory block exceeds a permissible threshold. Thereafter, memory accesses to non-failed-over memory blocks are still satisfied by the remaining memory blocks in the memory modules. An error log stores the transmitted error data to be processed to determine whether the error data exceeds the permissible threshold. Upon fail-over, a tag corresponding to the failed-over memory block is stored in a tag storage area, and the data, or digital information, that was stored in the failed-over memory block is transferred to a location in the auxiliary memory. The tag further corresponds to the auxiliary memory location for the transferred digital information. The auxiliary memory may be either embedded in the memory controller or external thereto. A tag look-up circuitry determines whether a memory access is to a failed-over memory block and provides a hit signal to the memory controller if it identifies a matching tag in the tag storage area, so that the memory access may be satisfied by the auxiliary memory location corresponding to the identified tag.

Therefore, it is desired to provide a memory fail-over system for a computer system that can fail-over individual memory blocks from multiple memory modules.

BRIEF DESCRIPTION OF THE DRAWINGS

A better understanding of the present invention can be obtained when the following detailed description of the preferred embodiment is considered is conjunction with the following drawings, in which.

DETAILED DESCRIPTION OF INVENTION

Figure 1:
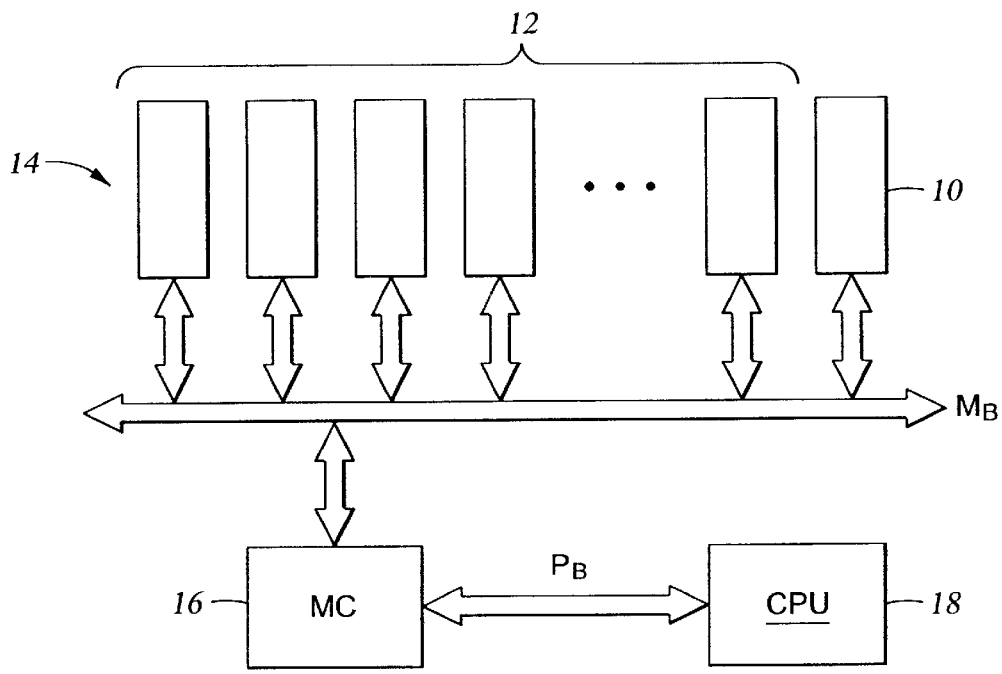
FIG. 1 is a schematic diagram of a prior art configuration for a memory fail-over system.

In order to understand the context of the present invention, a brief description of the prior art is presented. One technique for providing a fail-over system for the main memory of a computer is described in U.S. patent application Ser. No. 08/763,411, filed on Dec. 11, 1996, and assigned in common with the present application. This technique is illustrated in a simplified schematic in FIG. 1 wherein a standby memory module 10 is provided along with primary memory modules 12 in a memory array 14, so when it is determined to fail-over any one of the primary memory modules 12, the memory controller 16 can transfer all of the data or other digital information stored in the primary memory module 12 to the standby memory module 10 through a procedure such as a direct memory access (DMA) function. The memory controller 16 accesses the memory array 14 across a memory bus $M_B$ and communicates with the processor 18 across a processor bus $P_B$. Alternatively, one of the memory modules in the memory array may be optionally specified as a standby memory module, so that the user may choose to operate with a computer having either a standby memory module and less main memory or no standby memory and more main memory.

The transfer of the digital information in the primary memory module 12 should be performed when the memory controller 16 is otherwise idle, so as not to affect the performance of the computer system. Before completely transferring all of the digital information, memory read functions may be performed as normal, but write functions may be directed to the primary memory module 12, the standby memory module 10 or both.

After all of the digital information has been transferred to the standby memory module 10, and any correctable errors have been corrected, the memory controller 16 re-maps the entire memory address range for the failed-over memory module to the standby memory module 10. Thus, all subsequent reads, writes or other memory accesses directed to the failed-over memory module are redirected to the standby memory module 10 transparent to the rest of the computer system.

After fail-over is completed, the failed-over memory module may be rendered idle, or inactive, so a user can replace the failed-over memory module with a new memory module. It is even possible that the replacement may be done without powering-down the entire computer, since the failed-over memory module is not being used, so removal of the inactive failed-over memory module would not affect the performance of the computer. Some type of indicator, such as an LED in the memory array or a message on the computer display, may direct the user to the memory module to be replaced.

It is generally a requirement of this fail-over technique to ensure that the standby memory module 10 has at least as much memory address space as the largest primary memory module 12 in the memory array 14, so the standby memory module 10 will be able to hold the entire contents of any one of the primary memory modules 12.

The above-described fail-over technique may also be performed, at least partially, in software running on the host processor. In this case, software, rather than the DMA, transfers the information from the primary memory module to the standby memory module. ECC hardware generates a system management interrupt (SMI), such as INT 13, when the ECC logic detects either an uncorrectable or correctable error. The system software checks the interrupt to determine the source of the interrupt. If it was the ECC that generated the interrupt, then the system software accesses a storage location, such as a register, to determine the type, location and/or other information regarding the error. If the error was correctable, then the hardware performs the correction, and the software merely logs the error. The software keeps a running log of the errors and their locations, so that fail-over decisions can be made by the software when the errors for any given location exceed the permissible threshold. This technique is slower than the hardware-implemented technique described above, but is able to be used with existing memory controllers that provide fault information, such as ECC.

Figure 2:
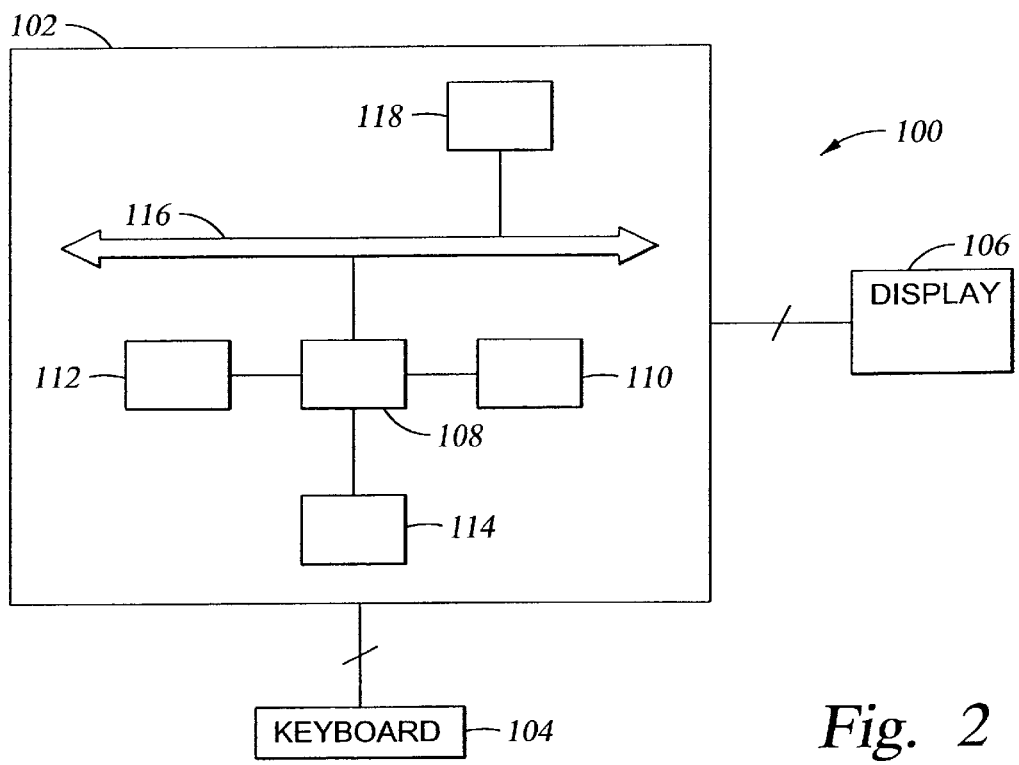
FIG. 2 is a general schematic diagram of a computer system.

With the present invention, FIG. 2 discloses a simplified schematic of a typical personal computer system 100 having a central processing unit section 102 connected to a keyboard 104 for inputting data from a user and a display unit 106 for providing a visual output. Generally, the fail-over subsystem 110 described below is part of the CPU section 102 and is part of or connected to a memory controller 108, which controls the transfer of digital information between a memory module array 112, a processing unit 114 and a bus subsystem 116. The digital information may be transferred to or from, for example, a mass storage device 118 coupled across the bus subsystem 116 to the memory controller 108. Although the fail-over system for a computer with multiple memory modules is described below with reference to a typical x86, or Intel, based computer system, it is understood that the invention is not so limited, but may be used with many different types of computer systems.

Figure 3:
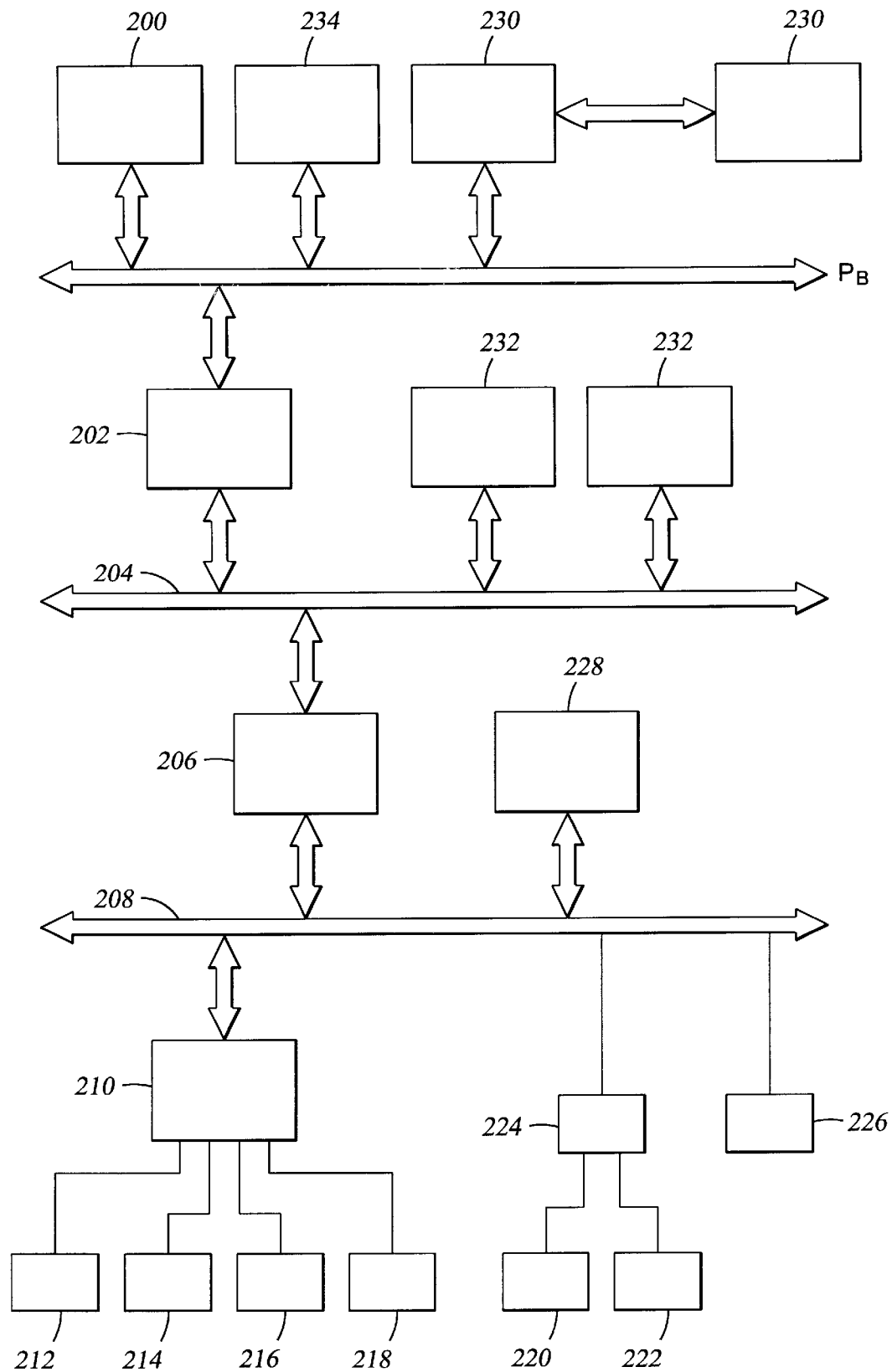
FIG. 3 is a simplified schematic diagram of an exemplary architecture for a computer system.

FIG. 3 discloses a simplified schematic of an exemplary architecture for a personal computer system 100. Although the fail-over system is described with reference to this schematic, it is understood that this schematic is only exemplary in nature and that the invention is not limited to use within a computer system having this particular architecture, but may be used in any computer system. The architecture is built around a number of bus systems. In this example, the processor 200 and other devices that communicate locally with the processor are interconnected with a processor bus $P_B$. The processor bus $P_B$ connects over a bus bridge 202 to a first bus 204, such as a Peripheral Component Interconnect (PCI) bus. Another bus bridge 206 connects the first bus to a second bus 208, such as an Industrial Standard Architecture (ISA) bus or an Extended ISA (EISA) bus. The bridges 202, 206 translate commands and information from one bus' communication protocol to the other bus' communication protocol, so that control, address and data signals may be transferred across bus platforms.

The devices that perform various functions of the computer system 100 typically attach to one of the buses $P_B$, 204, 208 to interact in the computer system 100. Such devices may include, but not be limited to, hard drives, floppy drives, CD ROM drives, parallel ports, serial ports, keyboards, a mouse, an audio subsystem, a graphic system, network interface cards, modems and the like. With a few exceptions, these devices typically have an interface for connecting to only one type of bus, so to be able to add many different types of devices to a computer system, many of today's personal computers are constructed with more than one type of bus.

In the example shown, an input/output (I/O) controller 210 may connect to the second bus 208 to provide control for various I/O devices, such as a hard drive or other mass storage device 212, a floppy drive 214, a parallel port 216, a serial port 218 or other device for inputting and/or outputting digital information to/from the computer system 100. Likewise, a keyboard 220 and mouse 222 may connect to the second bus 208 through a device 224, such as an 8742 keyboard controller, to permit direct input from the user. The computer system 100 may have other devices 226, such as an audio system, attached to the second bus 208. To provide further expansion or functionality, one or more additional slots 228, or female edge connectors, typically attach to the second bus 208 for a variety of available PCBs (not shown).

Similar to the second bus 208, the first bus 204 has a variety of devices attached thereto for performing various functions of the computer system 100. Since the first bus 204 is physically closer to the processor 200 than is the second bus 208, it is typically able to transfer information to/from the processor 200 or the memory system 230 more quickly than can the second bus 208. Therefore, devices 232, such as graphics controllers and network interface cards (NICs), that have high requirements for the rate of information transfer are preferably attached to the first bus 204 instead of the second bus 208. Recent developments in graphics capabilities have required graphics controllers to be able to handle full motion video with rapidly changing display images requiring high data transfer bandwidth, and demands on networking systems, such as for managing large databases or providing video on demand, require that NICs be capable of high information transfer rates as well, so these devices need to be provided with rapid access to the processor 200.

Almost all of the devices attached to the first or second bus 204, 208 mentioned above send and/or receive digital information to the processor 200 and/or the memory system 230, so the memory fail-over system, described below, receives and stores some of the digital information and provides it in response to certain memory accesses.

Devices that connect to the processor bus $P_B$, sometimes called the host bus, are typically devices for which the processor requires the fastest access. Thus, a cache system 234 and the memory system 230 are usually attached at this level. In some computer systems, other devices, such as the graphics controller, may also be connected to the processor's local bus to provide fast information transfer capabilities to those particular devices. However, since some computer makers optimize the processor bus' design for their choice of processors, cache and/or main memory, it is often infeasible to design or re-design the interfaces to these other devices to connect to the processor bus. In such cases, it is preferable to incorporate into the computer system an acceptable device that can be attached to one of the standard buses 204, 208. For those devices that must have local access to the processor 200, since their functions may be optimized for the particular computer system 100, many of their functions may be combined into a single device, such as a bridge interface, memory interface and cache interface.

A typical cache system 234 is a memory subsystem having a memory storage that is smaller and faster than the main memory storage in the memory system 230. Generally, the cache system 234 duplicates the information in a small number of the blocks of memory in the memory system 230 and includes a set of tags, or identifiers, indicating the addresses, or locations, of the blocks of memory which have been duplicated in the cache system 234. The information in the main memory is typically duplicated in blocks in the cache referred to as a cache line, such as 8, 16, 32, 64 or 128 (or other appropriate number of) bytes of memory. In this manner, when the memory system 230 is accessed, the cache system 234 can perform a simultaneous tag lookup to determine if the accessed location is duplicated in the cache memory storage. If the tag lookup results in a "hit," indicating that the requested memory location is duplicated in the cache memory storage, then the cache system 234 can satisfy the memory access from the cache memory storage more rapidly than can the memory system 230. The memory fail-over system which will be described below is analogous to the cache function with respect to the performance of the tag lookup and the satisfaction of a memory access from an alternative memory source. It is also preferred in the fail-over system to fail-over a block of memory corresponding to a cache line, since the computer system is already designed to support the rapid transfer of a cache-line of data.

Figure 4:
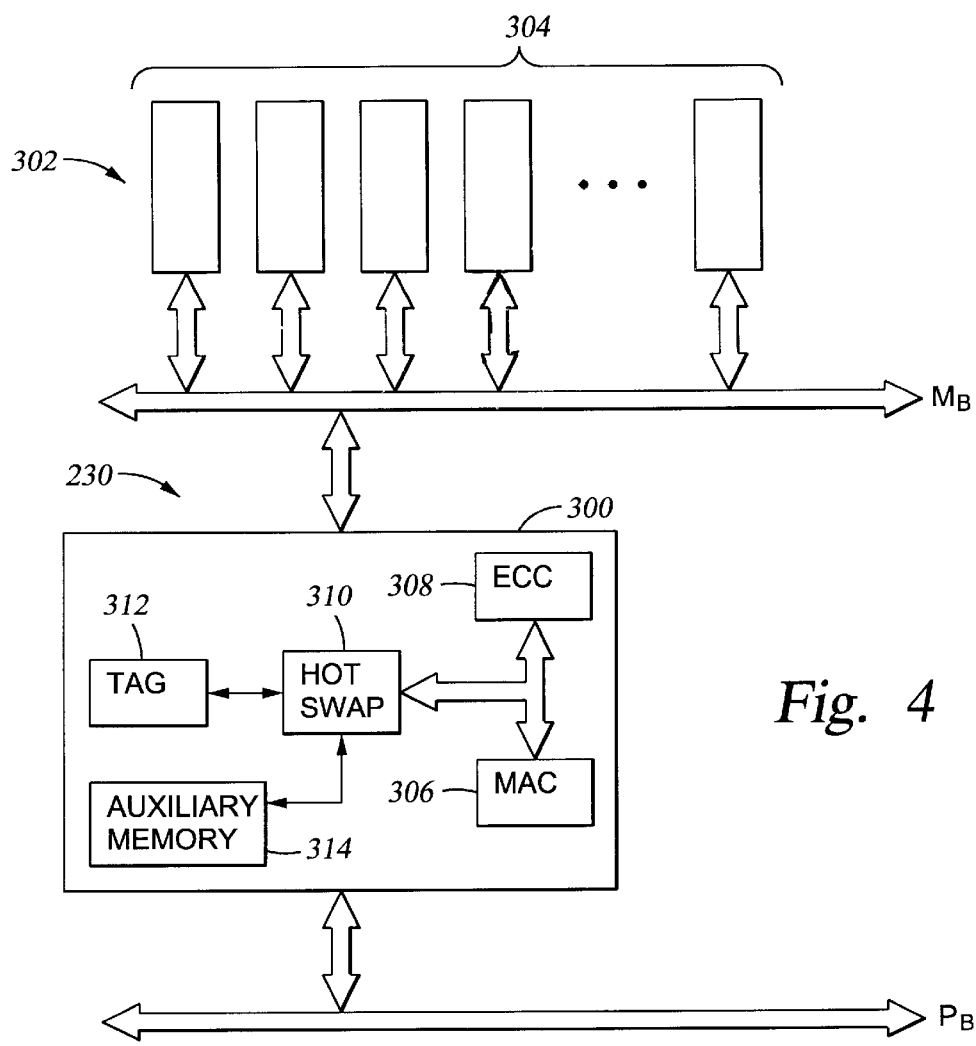
FIG. 4 is a simplified schematic diagram of a memory system.

FIG. 4 shows a simplified schematic of the memory system 230. Generally, a memory controller 300 controls data transfer between the processor bus $P_B$ and a memory array 302 having memory modules 304 for storing information. In the memory modules 304, the information is stored in memory blocks of an appropriate size, such as 16 bytes, 32 bytes, 64 bytes, 128 bytes or the like. The memory controller 300 typically communicates with the memory modules 304 of the memory array 302 across a memory bus $M_B$. A typical memory bus $M_B$ may be about 72 bits wide, with 64 data bits and 8 ECC check bits.

The memory controller 300 generally includes memory addressing and control (MAC) logic 306, error checking and correcting (ECC) logic 308, hot swap logic 310, tag logic 312 and an auxiliary memory 314. The MAC 306 handles accesses to the memory bus $M_B$ and the memory modules 304, beyond. The ECC 308 determines whether information returning from the memory array 302 contains errors and corrects the correctable errors. The hot swap logic 310 receives the error information from the ECC 308 and performs a fail-over of an individual memory block or entire memory module 304 which has an unacceptable error status. The tag logic 312 stores tags, or identifiers, indicating the memory blocks that have been failed-over from the memory modules 304 and provides pointers to the locations in the auxiliary memory 314 where the failed-over information is now stored. The auxiliary memory 314 stores the correct/corrected digital information from the failed-over memory blocks. When a memory request is received from the processor bus $P_B$, the tag logic 312 performs a tag look-up to determine whether the requested memory address space has been failed-over to the auxiliary memory 314 and, if so, causes the auxiliary memory 314 to respond to the memory request. The structure and function of the tag logic 312 will be described in greater detail below with reference to FIG. 7.

All digital information retrieved from the memory modules 304 passes through the ECC logic 308, which detects whether the information is corrupted, or contains an error. If the corrupted information can be corrected, then the ECC logic 308 corrects the error and informs the MAC 306 by asserting a correctable error signal. If the corrupted information cannot be corrected, then the ECC logic 308 does not correct the error and informs the MAC 30 by asserting an uncorrectable error signal. In typical computer systems that use ECC logic, if the corrupted information in uncorrectable by the ECC logic 308, a nonmaskable interrupt (NMI) is generated, which typically causes the computer system to shut down.

In the preferred embodiment of FIG. 4, the auxiliary memory 314 is an embedded ferroelectric-RAM (FeRAM) in the same IC chip as the rest of the memory controller 300, so that responses from the auxiliary memory 314 to memory accesses may be performed as quickly as possible and so that the space required for the auxiliary memory 314, and the fail-over portions of the memory controller 300 in general, is minimized. Thus, the auxiliary memory 314 may take advantage of the benefits of embedded RAM technology and the emerging FeRAM technology, particularly the higher speeds and space-saving benefits. A general description of embedded memory is provided in "Embedded memory: the all-purpose core," Brian Dipert, *EDN*, Mar. 13, 1998, p. 34, and is incorporated herein by reference as if fully set forth herein. A general description of FeRAM technology is provided in "Ferro RAMs headed for volume debut," Craig Matsumoto, *Electronic Engineering Times*, Mar. 9, 1998, p. 1, and is incorporated herein by reference as if fully set forth herein.

Figure 5:
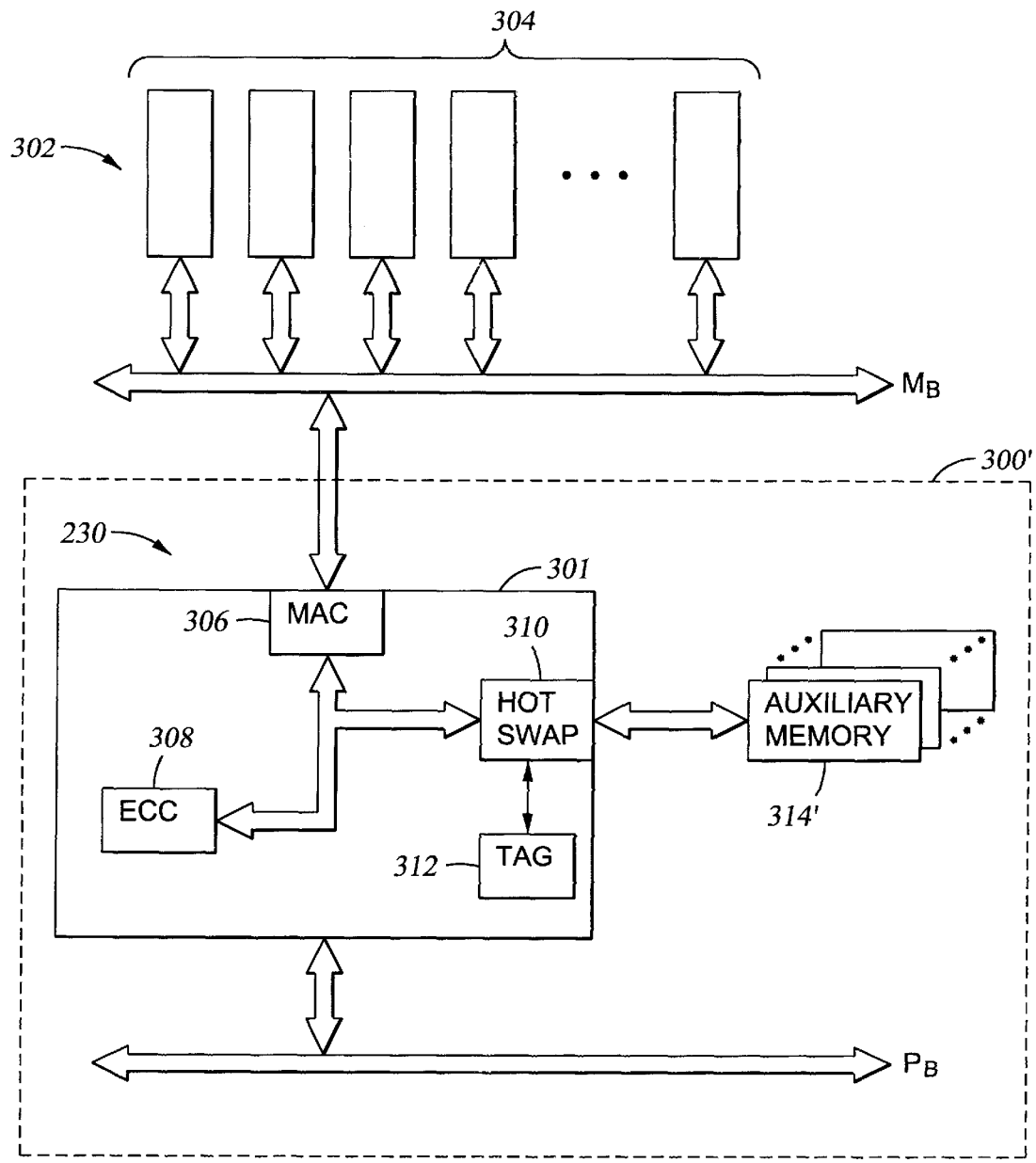
FIG. 5 is a simplified schematic diagram of another embodiment of a memory system.

FIG. 5 shows an alternative embodiment for the memory system 230 in which elements having similar reference numerals to elements in FIG. 4 also have similar functions and structures, and in which the auxiliary memory 314' of the memory controller 300' includes one or more IC chips external from the control portion 301, but typically mounted to the same printed circuit board (not shown). In this embodiment, the tag storage in the tag logic 312 is preferably included in the same IC as the tag lookup and the hot swap engine 310 to provide for fast tag lookup, so that the correct information may be accessed from the auxiliary memory 314' within an acceptable access time. Although, an external auxiliary memory 314' would typically be slower than an embedded auxiliary memory 314, the memory access time for the embodiment of FIG. 5 would still be at least as fast as an access to the memory array 302 and possibly as fast as an access to a typical cache memory system since the memory controller's fail-over function is analogous to the cache function.

Figure 6:
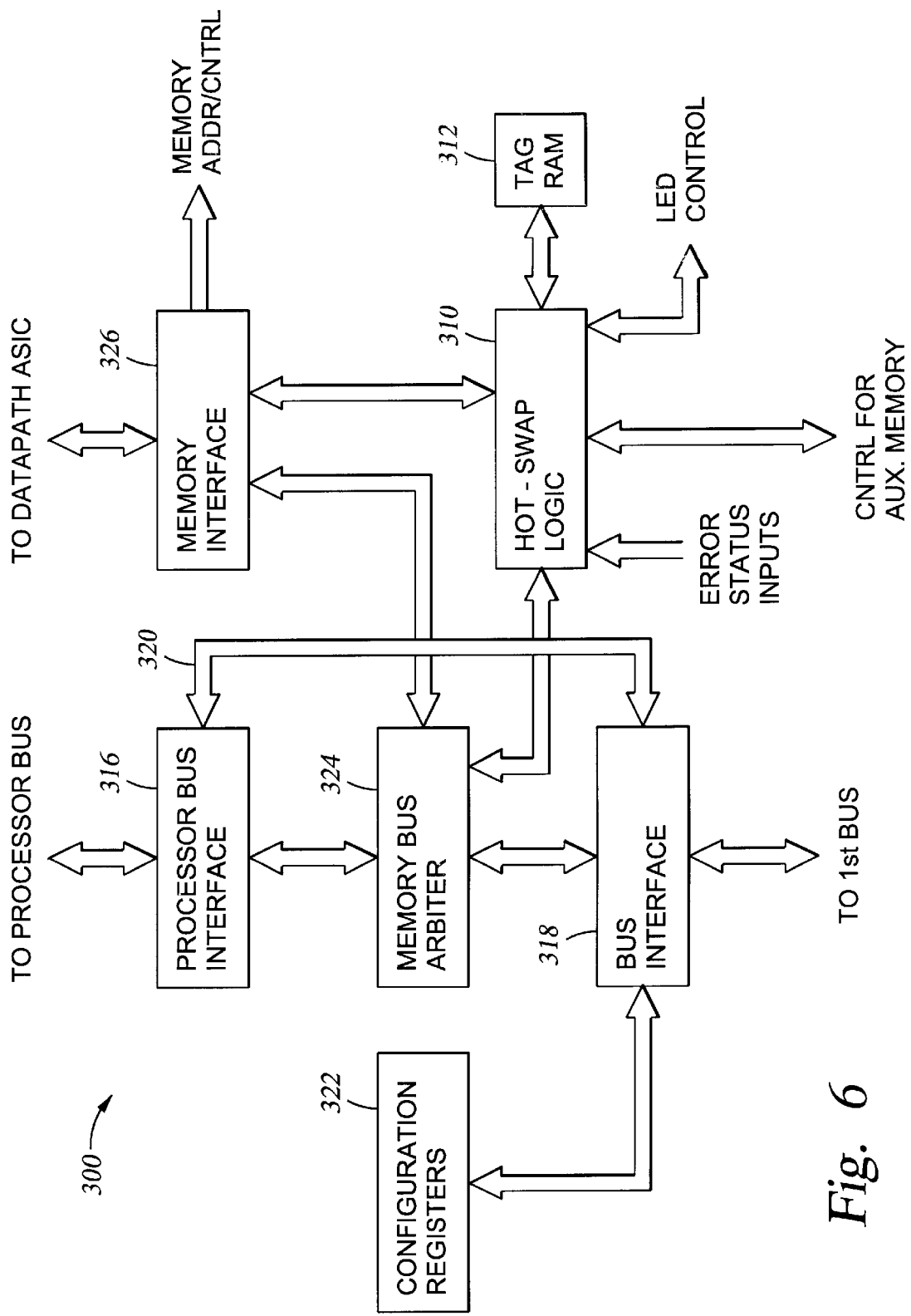
FIG. 6 is a simplified block diagram of a memory controller.

FIG. 6 shows a simplified block diagram of a preferred memory controller 300, wherein the functions of the bridge 202 between the processor bus $P_B$ and the first bus 204 shown in the generalized schematic of FIG. 3 is integrated into the same application specific integrated circuit (ASIC) as the functions of the memory controllers 300, 300' shown in FIGS. 4 and 5. As such, the memory controller 300 has a processor bus interface 316 for communicating information and control signals to/from the processor bus $P_B$ and a bus interface 318 for communicating information and control signals to/from the first bus 204. An information/control path 320 provides for communication between the processor bus interface 316 and the bus interface 318 for transferring signals that are translated between the two bus protocols and essentially passed between the processor bus $P_B$ and the first bus 204. A set of configuration registers 322 are coupled to the bus interface 318 to provide the configuration for the bus interface 318.

Disposed between and coupled to the processor bus interface 316 and the bus interface 318 is a memory bus arbiter 324 for arbitrating between each device that is requesting access to the memory array 302 (FIGS. 4 and 5) to permit only one device at a time to read or write information across the memory bus $M_B$. Before any device can access the memory bus $M_B$, it must request arbitration of the memory bus $M_B$, whereby the requesting device sends a signal to the memory bus arbiter 324 indicating that the device needs to access the memory bus $M_B$ and the memory array 302 beyond. The memory bus arbiter 324 arbitrates between memory bus requests to grant memory bus access typically to the device having the highest priority.

When the memory bus arbiter 324 grants access to the memory bus $M_B$ to a device, access is provided through a memory interface 326 coupled to the memory bus arbiter 324 for receiving memory access control and address signals from the memory bus arbiter 324. The memory interface 326 provides the actual control and address signal portions of the memory bus $M_B$ to the memory modules 304 in the memory array 302. The memory interface 326 also provides control signals to a datapath ASIC (not shown) which provides the data portion of the memory bus $M_B$.

The hot-swap logic 310 communicates with the memory interface 326 to intercept memory access information being sent to the memory modules 304 (FIGS. 4 and 5). In this manner, the hot-swap logic 310 can perform a tag lookup in the tag RAM 312 in parallel with the normal memory access to the memory array 302 to determine whether the memory access is to a memory block that has been failed-over, so the hot-swap logic 310 can send control signals for the auxiliary memory 314 to instruct the auxiliary memory 314 to respond to the memory access in place of the targeted memory module 304. The hot swap logic 310 also receives error status inputs from the ECC logic 308 to determine whether to fail-over a particular memory block or entire memory module 304. When a determination has been made to fail-over a memory block, the hot-swap logic 310 stores a tag identifying the failing memory block and communicates an arbitration request to the memory bus arbiter 324 to gain control of the memory bus $M_B$ to retrieve the information in the failing memory block. After the memory bus arbiter 324 grants the hot-swap logic 310 access to the memory interface 326, the hot-swap logic 310 accesses the memory block in the memory module 304 and copies the corrected information to the auxiliary memory 314. In the event that the hot-swap logic 310 fails-over an entire memory module 304, the hot-swap logic 310 deactivates that memory module 304 and may optionally send an LED control signal to an LED associated with the memory module 304 to visually indicate to a user the memory module 304 that has been deactivated, so the user can locate and replace the memory module 304. Additionally, in order to fail-over an entire memory module 304, the auxiliary memory 314 must be at least as large as the largest memory module 304.

The hot-swap logic 310 also includes several register bits by which the user or system software can reconfigure the fail-over memory option. One bit indicates whether the fail-over function is enabled or disabled. Another n bits correspond to the n memory slots so the hot-swap logic can set the appropriate bit to mask off an entire faulty module. One bit indicates whether a hot-swap procedure is in progress. Another n bits correspond to LED indicators, such as bi-colored amber/green LED's, for each of the n memory slots to indicate whether each slot is enabled or disabled, so the user will know which memory module 304 can be removed and replaced. One bit indicates whether it is permissible or not permissible to remove the faulty memory module 304 in the disabled memory slot. Another n bits specify the size of a memory block to be replaced, or failed-over. (e.g. a logical "0" may indicate 32 bytes, a logical "1" may indicate 64 bytes, etc.) Another n bits may specify the procedure to use to determine whether to replace, or fail-over, a memory block. It is understood that this particular set of register bits is merely representative of the types of configuration bits that a fail-over system may incorporate. Thus, the invention is not limited to use with only these configuration bits, but may be used with other combinations of configuration bits as deemed to be needed by the design.

Figure 7:
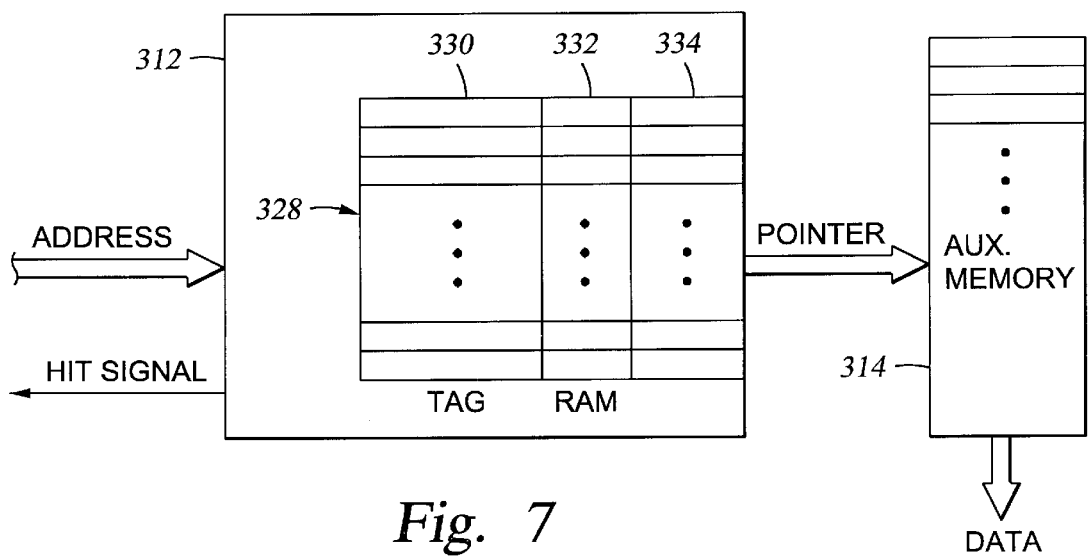
FIG. 7 is a schematic representation of a tag RAM and an auxiliary memory.

FIG. 7 shows a schematic representation of the tag RAM 312 and the auxiliary memory 314. The tag RAM has a set of tag storage locations 328, such as registers, preferably non-volatile, for storing the tags 330 and one or more valid bits 332 and a pointer 334 associated with the tags 330. The tag 330 is preferably the upper address bits of the memory block to which the tag 330 relates, so when a tag lookup is performed for a memory access to a specific address in the memory block, only the relevant upper address bits are compared with the bits in the tag storage 330 to determine a tag hit. Additionally, a valid bit 332 is associated with each memory block indicated by the tag 330. Since it is possible for a tag 330 to indicate a memory block that had been failed-over, but has been replaced with a properly functioning memory module, so that the information that had been failed-over to the auxiliary memory is no longer kept current, the valid bit 332 indicates whether the information stored in the auxiliary memory 314 for the indicated tag 330 is correct, or properly up-to-date. The pointer 334 is a variable indicating the starting address for the physical location in the auxiliary memory 314 wherein the valid failed-over information is stored. The result of a tag lookup hit in the tag RAM 312 is an output of the pointer data to the auxiliary memory 314. The pointer 334 typically points to the starting address of a block of memory in the auxiliary memory 314, so the access to a specific location in the auxiliary memory 314 may require the pointer data to point to the memory block within the auxiliary memory 314 and the lower address bits of the original address, not used to form the tag 330, to point to the specific location within the memory block. In an alternative embodiment, each tag storage location 328 is physically mapped to a particular memory block in the auxiliary memory 314, thus there is no variable pointer to the auxiliary memory 314.

For a system in which each tag 330 is associated with only one block of memory that has been failed-over, only one valid bit 332 is associated with the tag 330. However, for a system in which each tag 330 indicates multiple blocks of memory, usually contiguous blocks, then the tag RAM 312 will include one valid bit 332 for each block of memory associated with the tag 330.

Figure 8:
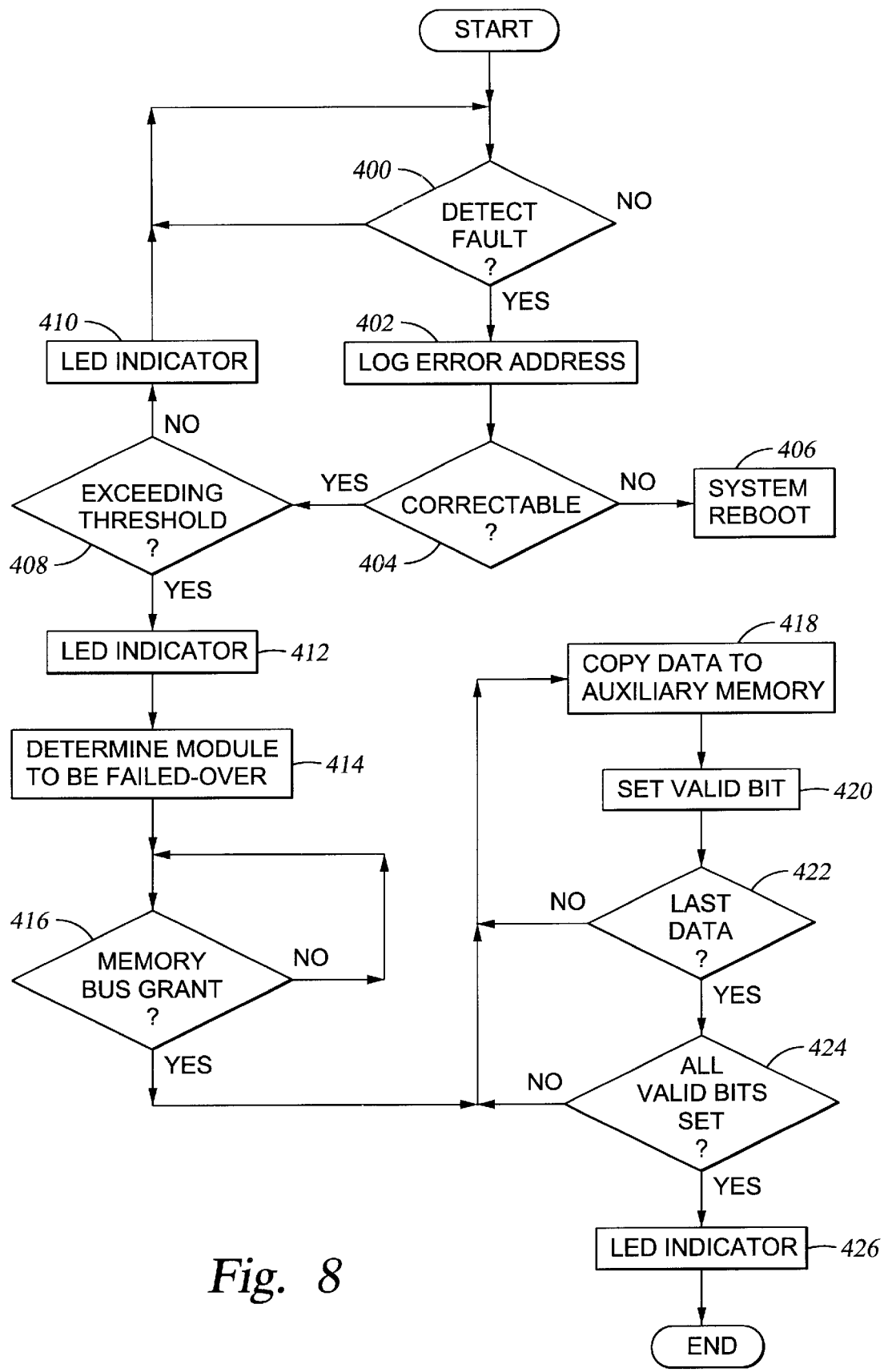
FIG. 8 is a flow chart for a hot-swap procedure.

In performance, when the ECC function of the memory controller 300 detects a single bit error, the memory controller is fully aware of the address location that produced the error and logs the address with the error to begin the hot-swap procedure as shown in FIG. 8. When the fail-over function of the memory controller 300 is enabled and the status of the auxiliary memory 314 after the built-in self-test (BIST) is indicated as okay, the hot-swap logic 310 remains in a loop at step 400 waiting for the detection of a fault, or correctable error signal from the ECC logic 308, in the data read from any memory location. After a fault is detected, the procedure continues to step 402 to log the address of the error in an error log. Preferably, the address is saved in the tag storage area 328 for subsequent use, while the valid bit 332 associated therewith remains invalid to indicate that the memory block has not been failed-over yet. If the error is determined not to be correctable at step 404, then the error may be fatal and the system may have to reboot in step 406. However, since the location of the error was previously recorded in non-volatile storage, when the computer system comes back up after reboot, the memory controller 300 will be aware not to use that memory location, so that memory location may be mapped-out of the memory array 302, or the fail-over system could be activated to intercept any memory accesses to that location. Otherwise, if the error is correctable, then the procedure determines in step 408 whether the total number of faults, or errors, in the error log for that particular memory location exceeds a permissible threshold. It is assumed that before the memory module becomes permanently damaged or experiences a hard fault it would give some kind of signal, such as multiple correctable errors to the same location. Thus, a permissible threshold for the number and type of errors may be specified.

The permissible threshold may be a hard-wired threshold or a user-programmable threshold for determining whether to fail-over a memory block. If a memory location generates more than, for example, three single-bit errors, then the hot-swap function will migrate the information stored in the associated memory block to a block in the auxiliary memory 314. Thus, if the permissible threshold has not been exceeded, then the procedure returns to the detect fault loop at step 400 at the beginning of the procedure. Additionally, an optional visual indicator, such as a flashing green LED associated with the memory module 304 from which the error was detected, may be set in step 410 to alert a user to the fact that this memory module 304 has experienced a fault, albeit non-catastrophic, so the user may be careful to watch for further faults from the same module 304 and may elect to replace the module 304 early if it becomes convenient to do so. If the permissible threshold has been exceeded, however, then the procedure may set in step 412 another optional visual indicator, such as an amber LED, to indicate that the associated memory module 304 has experienced a fail-over condition in at least one of its memory blocks, so the user can quickly identify which memory module 304 needs to be replaced. In another embodiment, the LED may be set to blink while the hot-swap procedure is in progress, so the user will be alerted not to remove the module 304 until the information has been fully failed-over. The LED indicator is especially useful when the entire memory module 304 is being failed-over, so the user can replace the indicated module before a catastrophic failure.

In step 414, the procedure determines which memory block or memory module 304 is to be failed-over or replaced. Preferably, a state machine performs a routine to check the addresses in the error log and the number of faults associated with each address to determine which memory block(s) is to be failed-over and records the upper address bits of the location to serve as the tag identifier and the starting address for the block of memory which will be copied to the auxiliary memory 314. If more than one location is to be failed-over, then a tag identifier is recorded for each memory block containing a failing-over location. After determining which block or module of memory is to be failed-over, the procedure requests arbitration of the memory bus $M_B$ through the memory bus arbiter 324 and waits in a loop for the grant of the memory bus $M_B$ at step 416.

There are several different types of procedures with prescribed rules for determining whether to fail-over a memory module 304 and which memory module 304 to fail-over. These procedures include, but are not limited to, the following examples. First, the memory module 304 having experienced the most recent uncorrectable fault may be failed-over. In this case, since the error was uncorrectable, the computer system is to be rebooted, and the information in the memory module 304 cannot actually be copied to the auxiliary memory 314. Rather, the system BIOS reprograms the memory controller 300, preferably through the hot-swap logic 310, to shut off the faulty memory module 304, so that when the system is rebooted, the auxiliary memory 314 will be used, instead. Second, the memory block or memory module 304 having the most correctable faults may be failed-over. This case assumes that the error-logging hardware can keep track of the correctable errors on a block-by-block or module-by-module basis. For example, a stack of FIFO (First-in/First-Out) registers may be used to log the errors. The depth of each FIFO should be equal to or greater than the threshold, or maximum, number of errors allowed, and the number of FIFO registers in the stack is the number of memory blocks or memory modules 304 of which the error-logging hardware can keep track. When each register in the stack contains some data, then the memory block or memory module 304 corresponding to the FIFO register with the most data therein must be failed-over before another memory block or memory module 304 can be logged. Third, the memory block or memory module 304 having the lowest MTBF (mean time between failures) may be failed-over. MTBF for each memory module 304 is calculated by summing the actual operating times of each memory module 304, including modules 304 that do not fail, and dividing that sum by the sum of all failures for each memory module 304. Each memory module 304 keeps track of its operating time through a built-in real-time counter. Fourth, a memory block or memory module 304 that experiences multiple errors exceeding a threshold level at the same address may be failed-over. This method may be modified to look for repeating errors at the same bit(s). For example, if a bit always reads as a 1, even when it is supposed to be a 0, then there is a good indication of a total failure of this bit, and the entire memory block should be failed-over before other bits in the memory block start to exhibit similar errors.

After the memory bus arbiter 324 grants memory bus access to the hot-swap logic 310, the hot-swap logic 310 interfaces with the memory bus $M_B$ to copy the information from the memory block containing the failing location to the auxiliary memory 314 at step 418. After the information has been copied, or failed-over, to the auxiliary memory 314, the valid bit is set in the tag storage 328 associated with the failed-over information at step 420 to indicate that the auxiliary memory 314 is now ready to satisfy memory accesses directed to the memory block.

In step 422, the procedure checks whether the last data, for which a tag identifier was recorded in step 414, has been failed-over. If not, then the procedure returns to step 418 to fail-over the next memory block. On the other hand, if there are no more fail-over requests, then the procedure continues to step 424 to check whether all of the valid bits have been set for the tag storage areas 328 which have just been failed-over, and if not, then the procedure returns to step 418 to continue to copy the desired information to the auxiliary memory 314. In other words, if more than one block of memory (represented by a valid bit 332) is associated with each tag 330, then each of the remaining memory blocks, even if they do not contain a memory location having an error, is also failed-over. Once all of the valid bits have been set, the procedure may optionally turn on the LED indicator in step 426 to indicate to a user that the fail-over has been completed and the memory module can be replaced. Furthermore, if the fail-over system has been set to fail-over an entire memory module, then the user can replace the memory module without powering-down, and interrupting performance of, the entire system. In this manner, the replacement of the module is similar to hot-plug memory, wherein a memory module may be removed and replaced at any time while the computer system is still running, with the exception that this fail-over system requires that the user wait until given permission to remove and replace the memory module.

During the above hot-swap procedure, if a memory write occurs to the same memory block that is being failed-over, the memory controller preferably performs a read-merge-write operation and sets the corresponding valid bit accordingly when done.

At system power-up, the main memory array 302 does not yet contain any data, so no information has been failed-over, so the auxiliary memory 314 contains no valid data. Thus, the valid bits 332 in the tag RAM 312 are set to the invalid, or default, state. For systems that have experienced fail-over memory conditions previously resulting in failed-over information stored in the auxiliary memory 314, however, the tags 330, or identifiers, for the previously failed-over memory blocks 304 will still be stored in the tag RAM 312, since the tag storage areas 328 consist of non-volatile memory cells. Therefore, as the system operates, any memory writes to the previously failed-over memory blocks 304 will be immediately diverted to the auxiliary memory 314, and the associated valid bit 332 will be set to valid.

Figure 9:
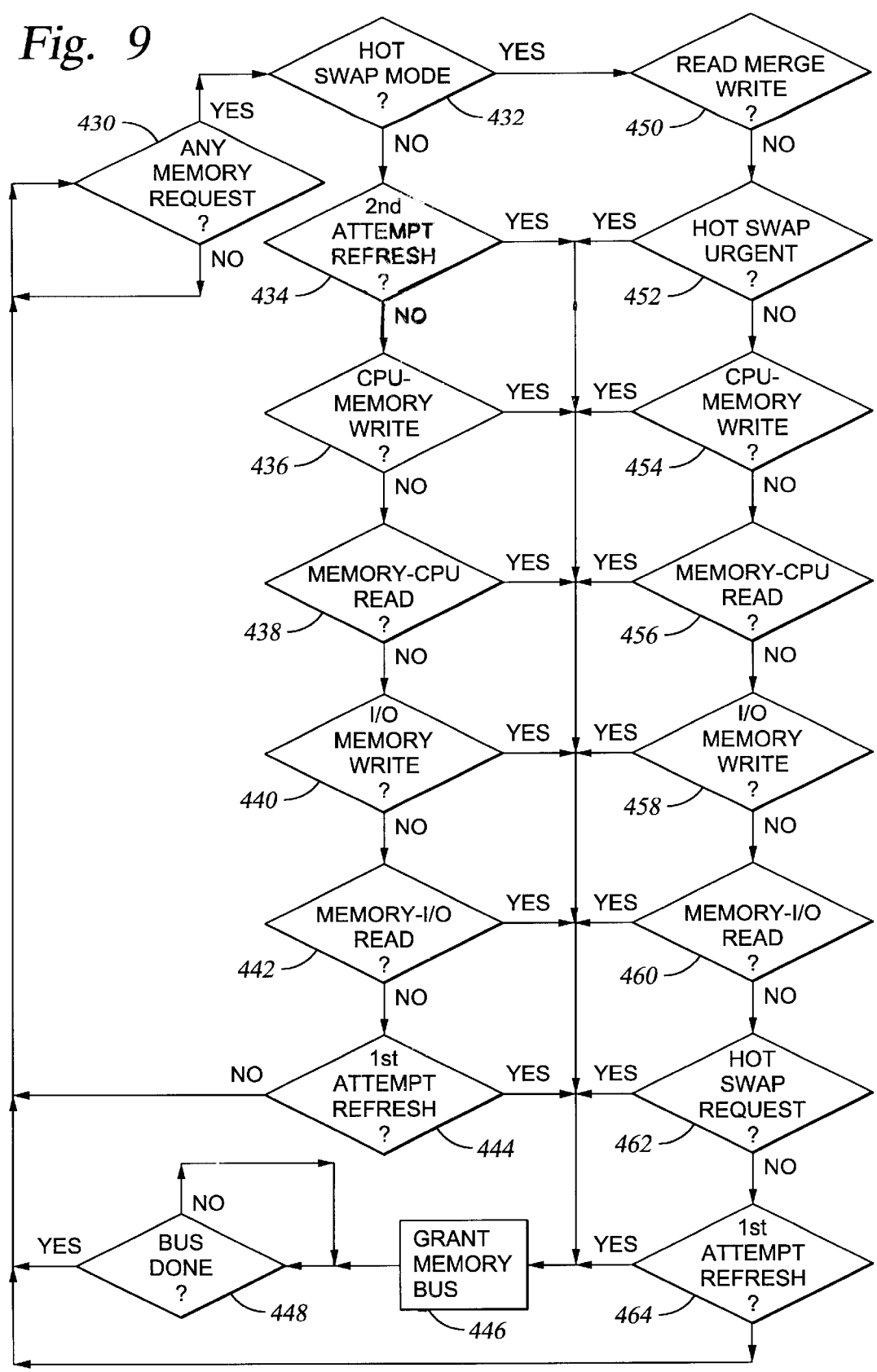
FIG. 9 is a flowchart for a memory arbitration procedure.

FIG. 9 shows the flowchart for the memory arbitration procedure of the memory bus arbiter 324 (FIG. 6) of the memory controller 300. The procedure starts in a loop at step 430 waiting for a memory request. Since it is possible for multiple memory requests to reach the memory bus arbiter 324 at approximately the same time, the procedure must check each possible type of request in the order of the priority given to each type. Additionally, since the memory controller 300 will only occasionally be in the hot-swap mode since memory locations are not expected to fail very often, the procedure determines whether the hot-swap mode is enabled at step 432 and proceeds through the priority list accordingly. Thus, the arbitration will proceed more quickly most of the time, since the extra steps required by the hot-swap mode will not be performed during every arbitration routine. Additionally, in the preferred embodiment, the memory controller 300 will only enter the hot-swap mode when it is otherwise idle. When the memory controller 300 becomes idle, and the hot-swap logic 310 needs to perform a fail-over procedure, then the memory controller 300, or hot-swap logic 310, will enter the hot-swap mode and issue a memory request to the memory bus arbiter 324.

When the memory controller 300 is not in the hot-swap mode, the highest priority will be any second attempt for memory refresh (step 434) since the volatile nature of the DRAMs in the memory modules 304 may cause a catastrophic loss of stored information. If there has been no second attempt for refresh, then the CPU has top priority with writes to and reads from memory in steps 436 and 438, respectively, to minimize wait times by the CPU. If the CPU has not requested the memory bus arbitration, then the I/O writes and reads in steps 440 and 442, respectively, have priority. Typically such I/O requests come from the first bus 204 (FIG. 3) through the bus interface 318. If there has been no memory request from the I/O devices, then a first attempt to refresh the DRAMs will be granted bus access at step 444. If, for some reason, none of the anticipated memory requests is determined to have actually made a request, then the procedure returns to the loop at step 430 to wait for a memory request. However, upon identification of the type of memory request in the priority list, the procedure continues to step 446 wherein the memory bus $M_B$ is granted to the requesting device. The procedure then waits in a loop at step 448 for the memory bus access to be completed before the procedure returns to the loop at step 430 to wait for another memory request.

Since it is possible for another memory request to reach the memory bus arbiter 324 after the memory controller 300 enters the hot-swap mode and before the hot-swap request is serviced, then at step 432 the procedure branches to step 450 to start determining the type of memory request in the order of their priority, including all of the steps described above when the memory controller 300 is not in the hot-swap mode, except for the second attempt for refresh at step 434. It is acceptable to include a check for a second attempt for refresh before or after step 450, but since the preferred hot-swap function is a very low priority function, running only in the background, the hot-swap logic 310 will not start a fail-over procedure and a memory request unless the memory controller 300 is otherwise idle; thus the memory controller 300 will not initiate the hot-swap mode if it is time for a DRAM refresh cycle, instead.

When the memory controller 300 is in the hot-swap mode and another memory access, such as a write, is made to the same memory block which the hot-swap logic 310 wants to fail-over, then the most efficient way to handle both accesses is to perform a read-merge-write at step 450, wherein the memory block is read from the memory module 304, merged with the other memory access, and written into the auxiliary memory 314. If there is no read-merge-write operation, then the procedure checks at step 452 to determine whether there is an urgent hot-swap request, such as when the error log indicates that a relatively large number of errors have been repeated recently for the same memory location indicating that a catastrophic failure may soon occur, and the hot-swap logic 310 has not been permitted to perform a fail-over procedure due to the fact that the memory controller 300 has not been idle. If there is no hot-swap urgent request, then the procedure continues on to check for CPU and I/O write and read requests in steps 454–460, similar to steps 436–442 described above. If there are no CPU or I/O memory requests, then the procedure checks for a non-urgent hot-swap request in step 462. If there have been no other memory requests, then the procedure checks for a first attempt for refresh in step 464. If any memory request was encountered in steps 450-464, then the procedure will branch to step 446 to grant the memory bus to the device that made the request. Afterwards, the procedure waits in a loop in step 448 until the device is done with the memory bus $M_B$ and then returns to step 430 to wait for another memory request.

Figure 10:
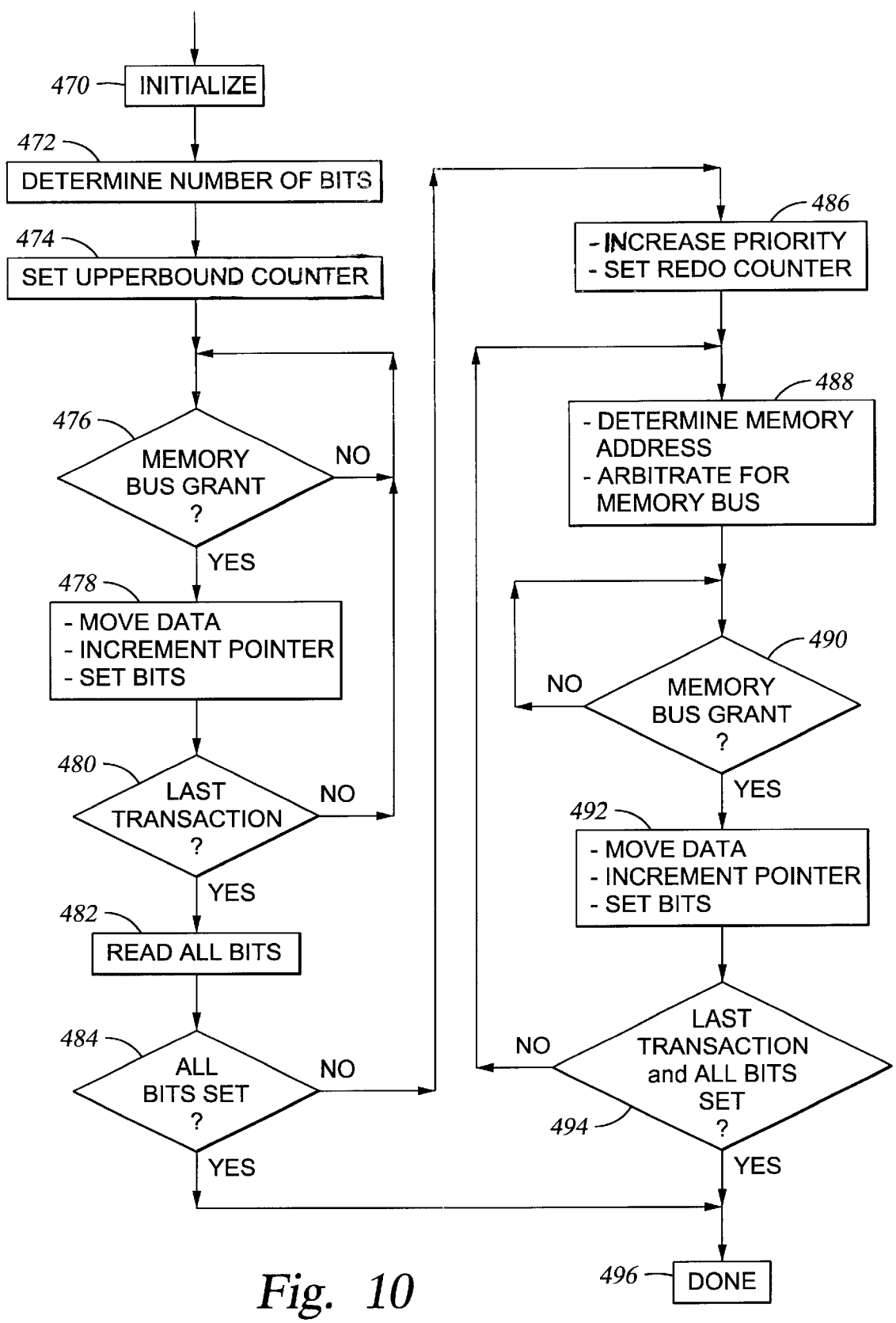
FIG. 10 is a flowchart for a scoreboard.

FIG. 10 shows a flowchart for a procedure referred to herein as the "scoreboard," wherein the status of a fail-over procedure is monitored, so the status can be saved during an interruption in the fail-over procedure, such as for servicing a higher priority memory request. A method for saving the status of an in-progress fail-over procedure is typically not needed if only one memory block is being failed-over, since the procedure will be allowed to complete before another memory request is serviced. However, when several memory blocks, up to an entire memory module 304, are to be failed-over, then other memory requests that come in to the memory controller 300 need to be able to interrupt the fail-over procedure. The preferred fail-over procedure described herein provides for failing-over individual memory blocks from multiple memory modules 304 and for alternatively failing-over an entire memory module 304, such as for when it has been determined to replace one of the memory modules 304 without powering-down the computer system. Thus, in the preferred embodiment, a scoreboard is provided to keep track of the last memory block copied to the auxiliary memory 314 and a way to determine whether a previously copied memory block has been written to by another device in the interim, so the corresponding auxiliary memory location can be updated. To keep track of the last memory block copied, the scoreboard maintains a pointer to that memory block or to the next memory block to be transferred.

If the hot-swap feature is enabled, then the procedure initializes all the counters and RAM to zero in step 470. In step 472, the procedure determines the number of bits required by the scoreboard to keep track of which memory blocks have been successfully copied and are valid. If another memory access interrupts the fail-over procedure and writes information to a memory block that the fail-over procedure has copied to the auxiliary memory 314, but before memory accesses to the failed-over memory can be redirected to the auxiliary memory 314, the corresponding scoreboard bits will be reset to "invalid." Typically, the number of bits is determined by the number of memory blocks to be transferred divided by the size of a cacheline. This number also indicates the number of transactions required to copy all the data from the faulty memory space, so in step 474, this number is used to set an upperbound counter to count the transactions as the fail-over procedure passes through the entire memory space.

In step 476, the procedure arbitrates for the memory bus $M_B$ and waits for the memory bus grant. After the fail-over procedure receives access to the memory bus $M_B$, in step 478, the procedure reads the information in the currently indicated memory block in the memory module 304, writes the information to the auxiliary memory 314, increments the pointer to indicate the next memory block to be copied, and sets the corresponding bits in the scoreboard and in the tag RAM 312 to indicate that the information has been copied and is valid. In step 480, the upperbound counter is decremented, and if the last transaction has not been completed, the procedure returns to step 476 for the next transaction.

After the procedure has performed all of the transactions and the memory space has been moved, the procedure reads all of the scoreboard bits, in step 482, and compares them to the corresponding valid bits 332 in the tag RAM 312. If a memory write has been made to the same main memory space that is being failed-over before the memory accesses are redirected to the auxiliary memory 314, then the corresponding valid bit(s) 332 will have been reset to "invalid." Thus, the comparison at step 482 with the corresponding scoreboard bits determines whether the procedure needs to go back to re-copy the changed memory blocks. If all of the bits are properly set to valid, then at step 484, the procedure will branch to the end 496. Otherwise, the scoreboard procedure instructs the hot-swap procedure to redo the outstanding transactions. An alternative embodiment is to permit the auxiliary memory 314 to respond to memory accesses as soon as a memory block is copied, instead of waiting until the entire memory module 304, or memory space, is transferred, so steps 484 to 494 would be unnecessary.

In step 486, the procedure may optionally increase the priority level of this type of memory access to make it less likely to be interrupted again. Additionally, a redo counter is set with the number of outstanding invalid bits, which corresponds to the number of memory blocks to be re-copied to the auxiliary memory 314. In step 488, the procedure determines the starting address of a memory block to be re-copied from the memory module 304 to the auxiliary memory 314 by translating the scoreboard bit into a memory address. Then the procedure requests arbitration of the memory bus $M_B$ and proceeds to step 490 where the procedure waits in a loop until it is granted access to the memory bus $M_B$. After the procedure receives access to the memory bus $M_B$, in step 492, the procedure moves information by reading from the designated memory block in the memory module 304 and writing the same information to the auxiliary memory 314. Then the procedure increments the pointer to the next memory block and sets the corresponding bit in the scoreboard to indicate a successful copying of the information. In step 494, the procedure checks whether the last transaction has been completed and whether all of the scoreboard bits are now set, and if both are true, then the procedure ends. Otherwise, the procedure returns to step 488 to service the next transaction.

The fail-over system described herein provides the user with the option to fail-over memory blocks from multiple memory modules 304 as well as to fail-over an entire memory module 304. In the case wherein the auxiliary memory 314 is filled with memory blocks from multiple memory modules, but it is indicated that an entire memory module 304 needs to be failed-over so the user can replace it with a new memory module 304, an alternative embodiment provides for writing the failed-over information back to all of the other memory modules 304 (provided the previously failed-over memory locations had only experienced correctable errors, so that the locations are still useable) to free up space in the auxiliary memory 314 to fail-over the indicated entire memory module 304. Then after the user replaces the indicated memory module 304, the failed-over information is written-back to the new memory module to free up space in the auxiliary memory 314 to fail-over memory blocks from multiple memory modules 304, again.

When a new memory module 304 has been inserted into a slot, before the hot-swap logic 310 can write-back the information from the auxiliary memory 314 to the new memory module 304, the memory controller 300 has to test the presence of the new memory module 314 and identify it through its serial presence detect port. The new memory module 304 must be at least the size of the removed memory module 304 for the hot-swap logic 310 to be able to write-back the information to the entire memory module 304.

A method and circuitry for removing and inserting memory modules 304 in a memory array 302 that may be used in conjunction with the above-described hot-swap system without powering-down the computer system is described in U.S. patent application Ser. No. 08/940,419, filed on Sep. 30, 1997, and assigned in common with the present application.

The foregoing disclosure and description of the invention are illustrative and explanatory thereof, and various changes in the details of the illustrated circuitry, flowcharts and construction and method of operation may be made without departing from the spirit of the invention.

What is claimed is:

1. A computer system comprising:

a bus subsystem for transferring digital information;

a processing unit for processing the digital information;

a mass storage device for storing the digital information and cooperatively coupled to the bus subsystem to transmit and receive the digital information;

a memory module array having multiple memory modules, each of the memory modules having multiple memory blocks for storing the digital information transmitted or received by the mass storage device;

a memory controller for controlling transfer, between the bus subsystem, the processing unit and the memory module array, of the digital information transmitted or received by the mass storage device; and a memory fail-over subsystem cooperatively coupled to fail-over individual memory blocks, and the digital information stored therein, of one or more of the memory modules; and an error monitoring circuitry cooperatively coupled to transmit error data to the memory controller, wherein the memory fail-over subsystem fails-over an individual memory block when the error data for the individual memory block exceeds a permissible threshold, and accesses to remaining memory blocks in the same memory module as the failed-over memory block are satisfied by the remaining memory blocks in the same memory module.

2. The computer system of claim 1 further comprising an auxiliary memory cooperatively coupled to receive the digital information intended for failed-over memory blocks, wherein accesses to individual failed-over memory blocks are satisfied by the auxiliary memory.

3. The computer system of claim 2 further comprising a tag storage having storage locations for storing tags identifying one or more failed-over memory blocks in one or more of the memory modules and pointing to a location in the auxiliary memory where the digital information intended for the failed-over memory blocks is stored.

4. The computer system of claim 3 further comprising a tag look-up circuitry cooperatively coupled to the tag storage to determine whether an access to a memory block is to a failed-over memory block and cooperatively coupled to the memory controller to provide a hit signal thereto if the access is to a failed-over memory block.

5. The computer system of claim 1 further comprising:

a tag storage having storage locations for storing tags corresponding to one or more memory blocks in one or more of the memory modules;

wherein a tag corresponding to a failed-over memory block is stored in the tag storage upon fail-over of the failed-over memory block.

6. The computer system of claim 5 further comprising:

an auxiliary memory cooperatively coupled to the memory controller to respond to memory accesses;

wherein:

the digital information stored in a failed-over memory block in a memory module is transferred to an auxiliary location in the auxiliary memory; and the tag corresponding to the failed-over memory block further corresponds to the auxiliary location for the transferred digital information.

7. The computer system of claim 6 wherein the auxiliary memory is an embedded memory in the memory controller.

8. The computer system of claim 6 wherein the auxiliary memory is external to the memory controller.

9. The computer system of claim 6 further comprising:

a tag look-up circuitry cooperatively coupled to the tag storage to determine whether an access to a memory block is to a failed-over memory block by identifying a tag stored in the tag storage and cooperatively coupled to the memory controller to provide a hit signal thereto if the access is to a failed-over memory block;

wherein, when the tag look-up circuitry identifies a tag corresponding to the accessed memory block, the memory block access is satisfied by the auxiliary location corresponding to the identified tag.

10. The computer system of claim 1 further comprising:

an auxiliary memory cooperatively coupled to the memory controller to respond to memory accesses;

wherein the digital information stored in a failed-over memory block in a memory module is transferred to the auxiliary memory.

11. The computer system of claim 1 further comprising:

an error log for storing the transmitted error data;

wherein the error data stored in the error log is processed to determine whether the error data exceeds the permissible threshold.

12. A memory controller for controlling functions of multiple memory modules, each having multiple memory blocks, comprising a fail-over circuitry for failing-over individual memory blocks in one or more of the memory modules; and an error monitoring circuitry receiving error data regarding errors in digital information returned from an accessed memory module, wherein the memory fail-over subsystem fails-over an individual memory block when the error data for the individual memory block exceeds a permissible threshold, and accesses to the non-failed-over memory blocks are satisfied by the memory blocks in the memory modules.

13. The memory controller of claim 12 further comprising an auxiliary memory cooperatively coupled to receive digital information intended for failed-over memory blocks, wherein accesses to individual failed-over memory blocks are satisfied by the auxiliary memory.

14. The memory controller of claim 13 further comprising a tag storage having storage locations for storing tags identifying one or more failed-over memory blocks in one or more of the memory modules and pointing to a location in the auxiliary memory where the digital information intended for the failed-over memory blocks is stored.

15. The memory controller of claim 14 further comprising a tag look-up circuitry cooperatively coupled to the tag storage to determine whether an access to a memory block is to a failed-over memory block and cooperatively coupled to the memory controller to provide a hit signal thereto if the access is to a failed-over memory block.

16. The memory controller of claim 12 further comprising:

a tag storage having storage locations for storing tags corresponding to one or more memory blocks in one or more of the memory modules;

wherein a tag corresponding to a failed-over memory block is stored in the tag storage upon fail-over of the memory block.

17. The memory controller of claim 16 further comprising:

an auxiliary memory capable of responding to memory accesses;

wherein:

the digital information stored in a failed-over memory block in a memory module is transferred to an auxiliary location in the auxiliary memory; and the tag corresponding to the failed-over memory block further corresponds to the auxiliary location for the transferred digital information.

18. The memory controller of claim 17 wherein the auxiliary memory is an embedded memory in the memory controller.

19. The memory controller of claim 17 wherein the auxiliary memory is external to the fail-over circuitry.

20. The memory controller of claim 17 further comprising a tag look-up circuitry cooperatively coupled to the tag storage to determine whether an access to a memory block is to a failed-over memory block, and providing a hit signal if the access is to a failed-over memory block, wherein the tag look-up circuitry identifies a tag corresponding to the failed-over memory block, and the memory block access is satisfied by the auxiliary location corresponding to the identified tag.

21. The memory controller of claim 12 further comprising an auxiliary memory responding to memory accesses, wherein the digital information stored in a failed-over memory block in a memory module is transferred to the auxiliary memory to satisfy subsequent memory accesses.

22. The memory controller of claim 12 further comprising an error log for storing the transmitted error data, wherein the error data stored in the error log is processed to determine whether the error data exceeds the permissible threshold.

23. A method of controlling accesses to multiple memory modules, each having multiple memory blocks, comprising the steps of:

monitoring errors in accesses to the memory blocks in relation to a permissible error threshold; and upon detection of monitored errors for a particular memory block exceeding the permissible error threshold, failing-over only the particular memory block;

whereby accesses to non-failed-over memory blocks are satisfied by the memory blocks in the memory modules.

24. The method of claim 23 further comprising the steps of:

detecting an access to a failed-over memory block; and satisfying the access to the failed-over memory block from an auxiliary memory block.

25. The method of claim 23 further comprising the step of performing a tag look-up to determine whether a memory block access is to a failed-over memory block.

26. The method of claim 25, wherein the looked-up tag indicates a corresponding auxiliary memory block, further comprising the step of confirming that digital information stored in the corresponding auxiliary memory block to the looked-up tag is valid.

27. The method of claim 25, wherein the looked-up tag indicates a corresponding auxiliary memory block, further comprising the step of sending a hit signal indicating that the access to the failed-over memory block will be satisfied by the corresponding auxiliary memory block.

28. The method of claim 25, wherein the looked-up tag indicates a corresponding auxiliary memory block, further comprising the step of accessing the corresponding auxiliary memory block indicated by the looked-up tag.

29. The method of claim 25, wherein the looked-up tag indicates a corresponding auxiliary memory block, further comprising the step of satisfying the access to the failed-over memory block from the corresponding auxiliary memory block.

30. The method of claim 23 further comprising the step of storing a tag value corresponding to the failed-over memory block.

31. The method of claim 30 further comprising the step of transferring digital information from the failed-over memory block to the auxiliary memory block.

32. The method of claim 31 further comprising the step of correlating the tag value with an auxiliary memory block.

33. The method of claim 30 further comprising the step of setting a valid flag for the tag value.

34. The method of claim 23 further comprising the step of transferring digital information stored in the failed-over memory block to an auxiliary memory location.

* * * * *